(12) United States Patent
Katakura

(10) Patent No.: US 6,187,513 B1
(45) Date of Patent: Feb. 13, 2001

(54) PROCESS FOR FORMING MASK PATTERN AND PROCESS FOR PRODUCING THIN FILM MAGNETIC HEAD

(75) Inventor: Toru Katakura, Miyagi (JP)

(73) Assignee: Sony Corporation, Tokyo (JP)

(*) Notice: Under 35 U.S.C. 154(b), the term of this patent shall be extended for 0 days.

(21) Appl. No.: 09/316,385

(22) Filed: May 21, 1999

(30) Foreign Application Priority Data

May 29, 1998 (JP) .................................... 10-150359

(51) Int. Cl.$^7$ ........................................................ G03C 5/00
(52) U.S. Cl. .................... 430/312; 430/394; 430/396; 430/313; 430/319; 430/320; 430/325
(58) Field of Search .................... 430/312, 394, 430/396, 319, 320, 325, 313; 360/113; 427/130, 131, 58, 264, 282

(56) References Cited

U.S. PATENT DOCUMENTS

| | | | | |
|---|---|---|---|---|
| 4,582,778 | * | 4/1986 | Sullivan | 430/273 |
| 4,670,297 | * | 6/1987 | Lee et al. | 427/91 |
| 5,656,414 | * | 8/1997 | Chou et al. | 430/312 |
| 5,744,284 | * | 4/1998 | Laub et al. | 430/313 |
| 5,817,446 | * | 10/1998 | Lammert | 430/315 |

* cited by examiner

Primary Examiner—Janet Baxter
Assistant Examiner—Amanda C. Walke
(74) Attorney, Agent, or Firm—Sonnenschein, Nath & Rosenthal

(57) ABSTRACT

It is to provide a process for forming a mask pattern and a process for producing a thin film magnetic head, in which burr is not formed on removing a resist.

The process for forming a mask pattern comprises a first coating step of coating a first resist on a surface, on which the mask pattern is formed; a first exposure step of forming a pattern latent image by exposing the first resist; a second coating step of coating a second resist on the first resist; a second exposure step of forming a pattern latent image by exposing the second resist; a first development step of forming an upper layer mask pattern by developing the second resist; and a second development step of forming a lower layer mask pattern by developing the first resist, the upper layer mask pattern having a resist bridge part, and a space being present between the resist bridge part and the surface, on which the mask pattern is formed.

15 Claims, 17 Drawing Sheets

ONE EMBODIMENT OF THIN FILM MAGNETIC HEAD

ONE EMBODIMENT OF THIN FILM MAGNETIC HEAD

ONE EMBODIMENT OF THIN FILM MAGNETIC HEAD

CROSS SECTIONAL VIEW ON LINE $X_5 - X_6$

CROSS SECTIONAL VIEW ON LINE $X_7$–$X_8$

ONE EMBODIMENT OF THIN FILM MAGNETIC HEAD

ONE EMBODIMENT OF THIN FILM MAGNETIC HEAD

CROSS SECTIONAL VIEW ON LINE $X_{11}-X_{12}$

CROSS SECTIONAL VIEW ON LINE $X_{13}$–$X_{14}$

CROSS SECTIONAL VIEW ON LINE $X_{15}$–$X_{16}$

CROSS SECTIONAL VIEW ON LINE $X_{17}$–$X_{18}$

PROCESS FOR FORMING MASK PATTERN AND PROCESS FOR PRODUCING THIN FILM MAGNETIC HEAD

RELATED APPLICATION DATA

The present application claims priority to Japanese Application No. P10-150359 filed May 29, 1998, which application is incorporated herein by reference to the extent permitted by law.

BACKGROUND OF THE INVENTION

1. Field of the Invention

The present invention relates to a process for forming a mask pattern and a process for producing a thin film magnetic head.

2. Description of the Related Art

Along with the development of a hard disk unit having a small size and a large capacity in recent years, a demand for a small-sized hard disk unit, such as a 2.5-inch type, is increased particularly in a field where an application to a portable personal computer is contemplated.

A magnetoresistance effect magnetic head (hereinafter referred to as an MR head), in which a change in resistance of a magnetic film having a magnetoresistance effect (hereinafter referred to as an MR film), the resistivity of which is changed depending on a magnetic field, is detected as a reproduced output voltage, receives attention as a magnetic head realizing a large capacity in a small-sized hard disk unit because it has such characteristics that a high reproduced output level can be obtained with a low media velocity.

The MR head is produced, for example, in such a manner that an MR film, an electrode film, an insulating film and the like are formed on a non-magnetic substrate by a thin film process, and these films are etched to a desired shape by a photolithography process.

For example, in the case where a magnetoresistance effect device (hereinafter referred to as an MR device) is produced, a thin film for an MR device comprising an MR thin film is formed on a surface on which the MR device is to be formed. A resist is then coated on the thin film for an MR device. Exposure to light and development are conducted for the resist to form a resist pattern having a desired shape. Specifically, the resist pattern has such a pattern in that the resist remains in a part to be the MR device. Etching is then conducted by using the resist pattern as a mask to remove the thin film for an MR device exposed from the mask. The etching is conducted, for example, by ion etching. Finally, the resist is removed to obtain a state in that the MR device is formed at the prescribed position.

When the MR film exposed from the mask is removed by etching using the resist pattern as the mask, a problem arises in that the thin film for an MR device removed by etching is re-attached to the side surface of the resist.

When the MR film removed by etching is re-attached to the resist, the attached MR film forms burr on the side surface of the MR film on removal of the resist. The formation of burr not only greatly lowers the sensitivity of the MR device but also becomes a reason of deterioration of a yield of the MR head.

The burr has been mechanically removed by scraping the surface of the MR device with a brush and washing with water. However, the surface of the MR device is damaged by this method. Furthermore, another problem arises in that the MR device is deteriorated by water used for washing.

In order to suppress the re-attachment of removed matters by etching and the formation of the burr due to the re-attached matters, improvement of a cross sectional shape of the mask patterns has been proposed, but a satisfactory effect has not been obtained.

SUMMARY OF THE INVENTION

The invention has been developed under the circumstances described above. An object of the invention is to provide a process for forming a mask pattern in that even when removed matters formed by etching are re-attached to a resist, burr is not formed on removing the resist, and a process for producing a thin film magnetic head using the same.

The invention relates to a process for forming a mask pattern comprising a first coating step of coating a first resist on a surface, on which the mask pattern is formed; a first exposure step of forming a pattern latent image in the first resist by exposing the first resist; a second coating step of coating a second resist on the first resist, in which the pattern latent image is formed in the first exposure step; a second exposure step of forming a pattern latent image in the second resist by exposing the second resist; a first development step of forming an upper layer mask pattern by developing the second resist, in which the latent image is formed in the second exposure step, with a first developer; and a second development step of forming a lower layer mask pattern by developing the first resist, in which the latent image is formed in the first exposure step, with a second developer, the upper layer mask pattern having a resist bridge part in a resist remaining part, in which the second resist remains, the bridge part bridging over a part of the lower mask pattern, in which the first resist is removed, and a space being present between the resist bridge part and the surface, on which the mask pattern is formed.

In the process for forming a mask pattern according to the invention, the second resist is coated on the first resist, in which the prescribed pattern latent image has been formed, and then the second resist is exposed to form the prescribed pattern latent image in the second resist. Thereafter, in the process for forming a mask pattern according to the invention, the upper layer mask pattern is formed by developing the second resist, and then the lower layer mask pattern is formed by developing the first resist. Therefore, the resist bridging part, which provides a space between the resist bridging part and the mask pattern forming surface, is easily formed in the upper layer mask pattern.

The invention further relates to a process for producing a thin film magnetic head comprising a thin film forming step of forming a thin film constituting the thin film magnetic head on a surface; a mask pattern forming step of forming a mask pattern on the thin film formed in the thin film forming step; and an etching step of shaping the thin film by removing the thin film that is exposed from the mask pattern formed in the mask pattern forming step by etching, the mask pattern forming step comprising a first coating step of coating a first resist on the thin film; a first exposure step of forming a pattern latent image in the first resist by exposing the first resist; a second coating step of coating a second resist on the first resist, in which the pattern latent image is formed in the first exposure step; a second exposure step of forming a pattern latent image in the second resist by exposing the second resist; a first development step of forming an upper layer mask pattern by developing the second resist, in which the latent image is formed in the second exposure step, with a first developer; and a second development step of forming a lower layer mask pattern by developing the first resist, in which the latent image is formed in the first exposure step, with a second developer, the upper layer mask pattern having a resist bridge part in a resist remaining part, in which the second resist remains, the bridge part bridging over a part of the lower mask pattern, in which the first resist is removed, and space being present between the resist bridge part and the surface, on which the mask pattern is formed.

In the process for producing a thin film magnetic head according to the invention, the mask pattern formed in the mask pattern forming step has a two-layer structure comprising the upper layer mask pattern and the lower layer mask pattern, and the upper layer mask pattern has a resist bridge part, which provides a space between the resist bridge part and the thin film. Therefore, in the etching step of the process for producing a thin film magnetic head, deterioration of the prescribed shape of the thin film due to the re-attachment of the thin film removed by etching to the mask pattern is prevented by etching using the mask.

DESCRIPTION OF THE PREFERRED EMBODIMENTS

Embodiment 1

A preferred embodiment of the invention will be described below.

Figure 1:
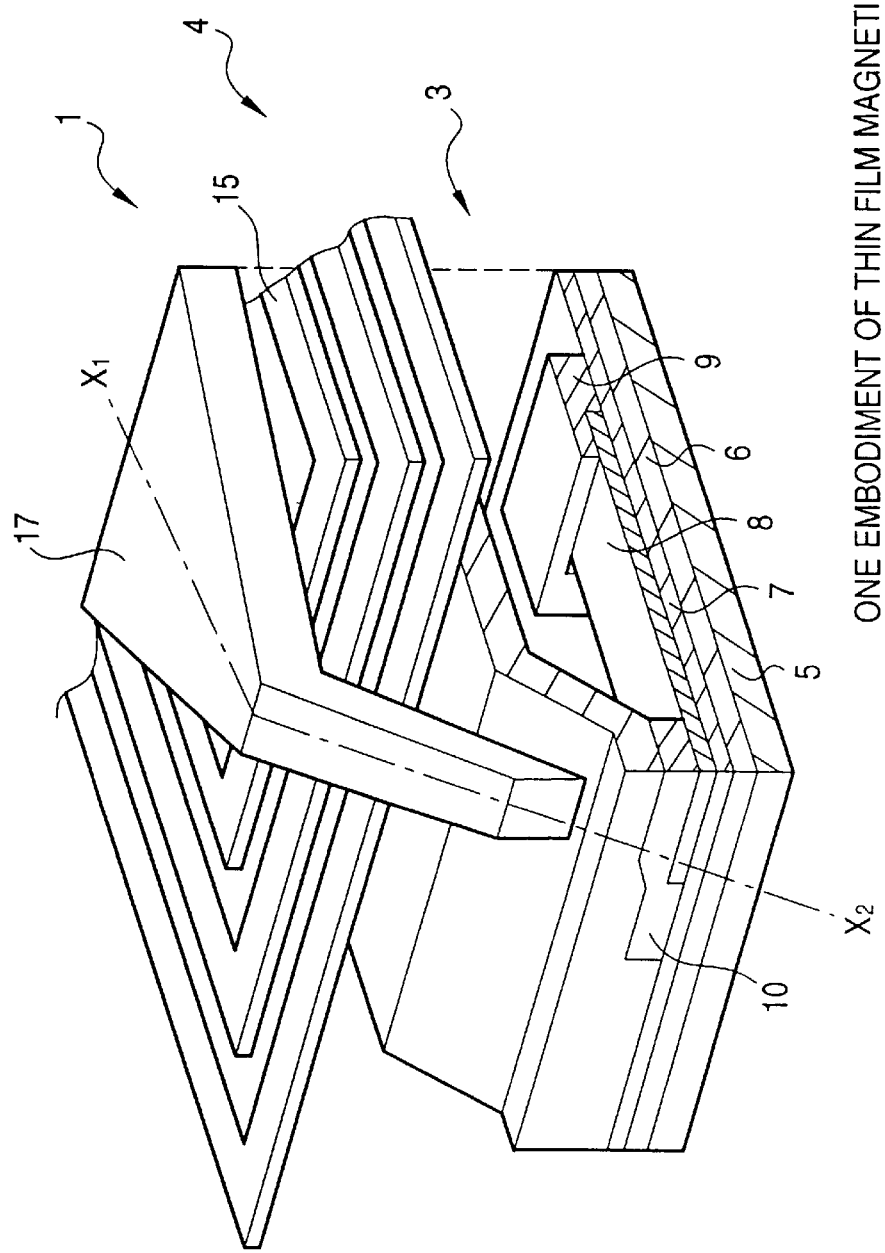
FIG. 1 is a perspective view showing an important part of one embodiment of the thin film magnetic head produced by applying the invention.
Figure 2:
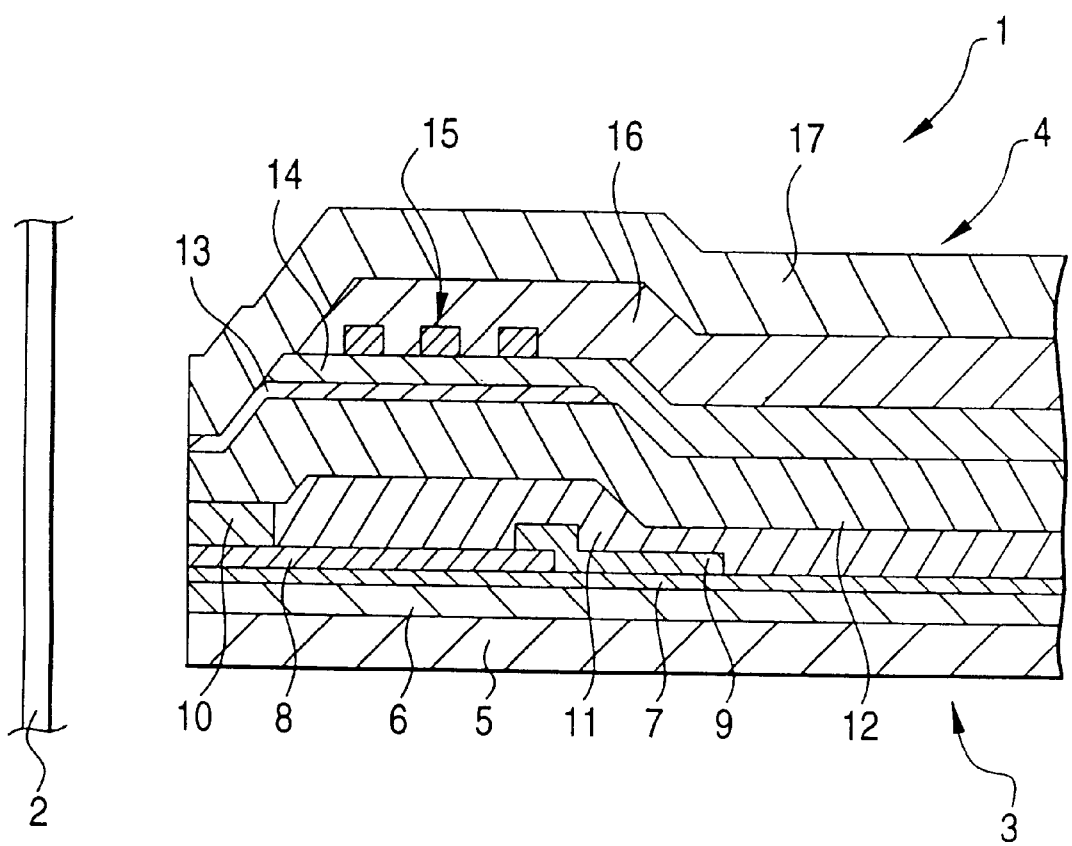
FIG. 2 is a cross sectional view taken on line $X_1$-$X_2$ in FIG. 1.

FIGS. 1 and 2 show one embodiment of a thin film magnetic head 1 produced by applying the invention. FIG. 1 is a perspective view showing an important part of the thin film magnetic head 1, and FIG. 2 is a cross sectional view taken on line $X_1$-$X_2$ in FIG. 1. The thin film magnetic head 1 comprises an MR head part 3 reproducing an information signal from a magnetic recording medium 2 and an inductive magnetic head part 4 recording an information signal on the magnetic recording medium 2.

The MR head part 3 comprises a substrate 5 comprising a non-magnetic material, such as $Al_2O_3$—TiC, a lower magnetic layer 6 formed on the substrate 5, an insulating layer 7 formed on the lower magnetic layer 6, an MR device 8 comprising a spin valve film having a plane substantially rectangular shape (hereinafter referred to as an SV type MR device) formed on the insulating layer 7, a back end electrode 9 connected to one end (referred to as a back end for convenience herein) of the longitudinal direction of the SV type MR device 8, a front end electrode 10 connected to another end (referred to as a front end for convenience herein) of the SV type MR device 8, an insulating layer 11 formed over the SV type MR device 8, the back end electrode 9 and the front end electrode 10, and a upper magnetic layer 12 formed on the insulating layer 11.

The MR head part 3 comprises the SV type MR device 8 having a plane substantially rectangular shape, the back end electrode 9 and the front end electrode 10 being sandwiched by the lower magnetic layer 6 and the upper magnetic layer 12. The MR head part 3 is arranged in such a manner that the longitudinal direction of the sv type MR device 8 is substantially perpendicular to the signal recording surface of the magnetic recording medium 2, and the front end of the SV type MR device 8 faces the magnetic recording medium 2, to form a so-called vertical MR head.

The spin valve film (hereinafter referred to as an SV film) basically has a 4-layer structure comprising a first ferromagnetic layer, a non-magnetic layer, a second ferromagnetic layer and an antiferromagnetic layer laminated in this order. The first ferromagnetic layer and the second ferromagnetic layer are separated by the non-magnetic layer, and the antiferromagnetic layer is formed on the second ferromagnetic layer, to obtain a state of the second ferromagnetic layer, which is in contact with the antiferromagnetic layer, magnetized in a constant direction (such a ferromagnetic layer is called as a pin layer hereinafter). On the other hand, the first ferromagnetic layer separated by the non-magnetic layer does not have a constant magnetization direction (such a ferromagnetic layer is called as a free layer hereinafter). Therefore, the pin layer has a large coercive force, but the free layer has a small coercive force. When a magnetic field is applied to the spin valve film having the structure described above, the magnetization direction of the free layer is determined. When the magnetization direction of the free layer is opposite to the magnetization direction of the pin layer, i.e., they form 180°, the resistance of the spin valve film becomes maximum. When the magnetization directions of the free layer and the pin layer agree to each other, the resistance of the spin valve film becomes minimum. In the SV type MR device 8, detection of an external magnetic field is conducted by using the change in resistance of the SV film.

As the free layer and the pin layer, a known soft magnetic material, such as NiFe, NiFeCo and a permalloy, can be used. As the non-magnetic layer, Cu, CuNi and CuAg can be used, for example. As the antiferromagnetic layer, IrMn, RhMn, PtMn, FeMn, CrMnPt, NiO and NiCoO can be used, for example.

The back end electrode 9 and the front end electrode 10 are provided to overlap both the ends of the longitudinal direction of the SV type MR device 8, and a sense electric current is passed in the SV type MR device 8 from the back end electrode 9 toward the front end electrode 10.

The upper magnetic layer 12 is connected to the front end electrode 10 of the SV type MR device 8, and is bent near the part facing the magnetic recording medium 2 to extend from the upper side toward the side of the back end electrode 9. The upper magnetic layer 12 comprises a conductive material and functions as a lead part of the front end electrode 10. A gap formed between the tip ends of the upper magnetic layer 12 and the lower magnetic layer 6 becomes a magnetic gap. The upper magnetic layer 12 also functions as a lower magnetic core of the inductive magnetic head part 4 as described later.

The vertical MR head part 3 can detect a signal magnetic field from the magnetic recording medium 2 by using the change in resistance of the SV type MR device 8 caused by the external magnetic field.

The inductive magnetic head part 4 comprises the upper magnetic layer 12 as a lower magnetic core, a gap film 13 as a magnetic gap formed on the upper magnetic layer 12, a first flattening layer 14 formed on the gap film 13, a conductor coil 15 formed in a spiral form on the first flattening layer 14, a second flattening layer 16 formed on the conductor coil 15, and an upper magnetic core 17 comprising a soft magnetic material formed on the second flattening layer 16.

In the inductive magnetic head part 4, a closed magnetic circuit is formed by the upper magnetic layer 12 (lower magnetic core) and the upper magnetic core 17. Therefore, in the inductive magnetic head part 4, difference in magnetic potential between the lower magnetic core and the upper magnetic core 17, and a magnetic flux caused by the difference in magnetic potential effectively crosses an electric current passing through the conductor coil 15, to conduct application of a recording magnetic field to the magnetic recording medium 2.

A process for producing the thin film magnetic head 1 will be described below.

An MR head part 3 is produced. A lower magnetic layer 6 comprising a soft magnetic material is formed on a non-magnetic substrate 5 comprising $Al_2O_3$—TiC, for example. An insulating layer 7 comprising $Al_2O_3$, for example, is laminated on the lower magnetic layer 6. The insulating film 7 forms a magnetic gap of the MR head part 3. An SV film to be an SV type MR device 8 is formed on the insulating layer 7.

The SV type MR device 8 is then produced. A resist is coated on the SV film, and a mask pattern, in which the resist remains on only a part to be the SV type MR device 8, is formed by a photolithography process. A method for forming the mask pattern will be described later in more detail.

Etching is conducted by using the mask pattern as a mask to remove the SV film exposed from the mask. The etching is conducted by ion etching, for example. Finally, the resist is removed to form the SV film in the prescribed shape, and the SV type MR device 8 is completed.

A back end electrode 9 for supplying a sense electric current to the SV type MR device 8 is formed at a back end of the SV type MR device 8. An insulating film 11 is then laminated on the SV type MR device 8 and the back end electrode 9.

A front end electrode 10 for supplying a sense electric current to the SV type MR device 8 is formed at a tip end of the insulating film 11, and an upper magnetic layer 12, which also functions as a lower magnetic core of an inductive magnetic head part 4, is formed on the front end electrode 10, to complete the MR head part 3.

The inductive magnetic head part 4 is then produced. A gap film 13 is formed on the upper magnetic layer 12. A first flattening layer 14 is formed, by which the surface of the gap film 13 is flattened to form a conductor coil 15 in a precise manner. The first flattening layer 14 may a polymer material.

The conductor coil 15 is formed on the first flattening layer 14 by a pattern plating method or ion etching. The conductor coil 15 may comprise a conductive material, such as Cu.

A second flattening layer 16 is then formed on the conductor coil, and the surface of the second flattening layer 16 is polished to be flattened. An upper magnetic core 17 is formed on the second flattening layer 16 by sputtering, and the upper magnetic core 17 is formed into a prescribed shape by etching.

The inductive magnetic head part 4 is formed through the process described above to complete the thin film magnetic head 1.

The process for forming the mask pattern for forming the SV type MR device 8 of the MR head part 3 will be described in more detail with reference to FIGS. 3 to 13.

Figure 3:
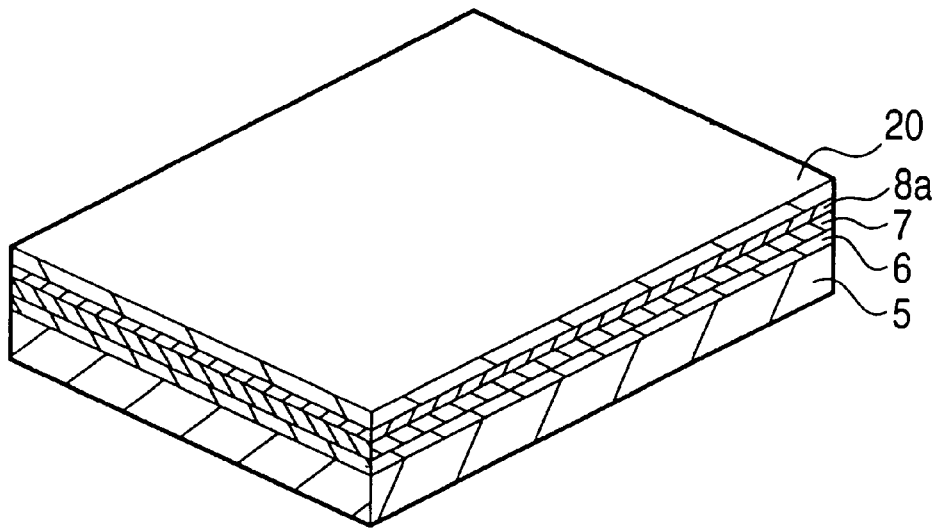
FIG. 3 is a cross sectional perspective view showing one embodiment of the process for forming a mask pattern, in which the first resist is coated on the SV film.

While rotating a substrate 5 having formed thereon a lower magnetic layer 6, an insulating layer 7 and an SV film 8a to be an SV type MR device 8, as shown in FIG. 3, at, for example, about 3,000 rpm, a first resist 20 is coated on the SV film 8a to a thickness of, for example, about 0.2 μm. As the first resist 20, an electron beam resist can be used. The electron beam resist used herein means a product, in which a polymer molecule constituting the resist receives an energy by collision with an electron, and a part of the chain of the polymer molecule is cut to make the molecular weight small, or the polymer molecule is combined with another polymer molecule to form a polymer molecule having a larger molecular weight. The first resist 20 is preferably a positive resist, a part of which irradiated with an electron beam suffers increase in solubility to a developer. Specific examples of the positive electron beam resist include OEBR-1000 (a trade name, produced by Tokyo Ohka Kogyo Co., Ltd.).

The first resist 20 coated on the SV film 8a is subjected to pre-baking before exposure. By conducting pre-baking, the sensitivity of the first resist 20 is increased to form a fine pattern in a precise manner. The pre-baking is conducted by using a clean oven in an air atmosphere at a temperature of from 180 to 200° C. for about 30 minutes.

Figure 4:
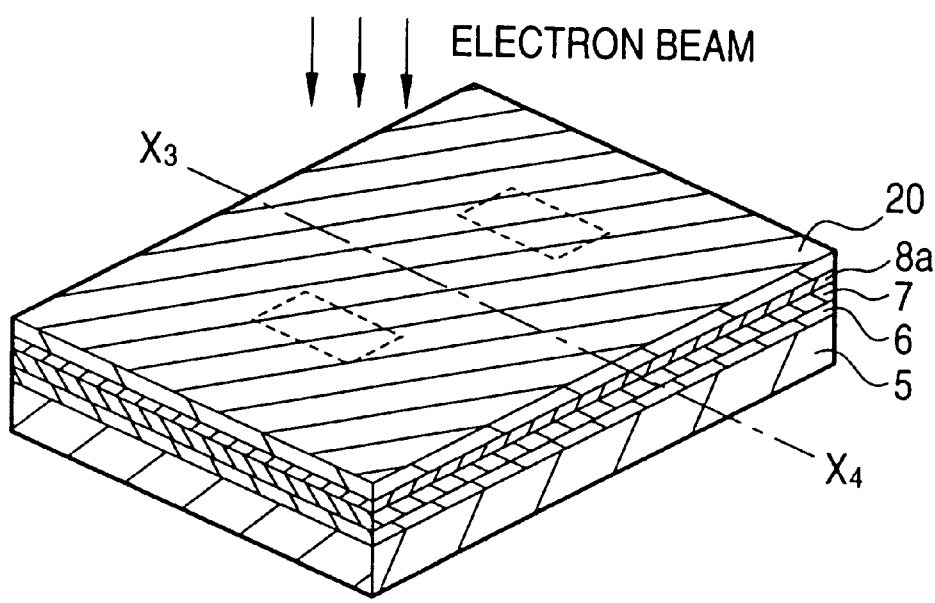
FIG. 4 is a cross sectional perspective view showing one embodiment of the process for forming a mask pattern, in which the first resist is exposed.

As shown in FIG. 4, a prescribed pattern is written on the first resist 20 by irradiating with an electron beam by, for example, an electron beam exposing apparatus to form a pattern latent image in the first resist 20.

Specifically, an electron beam is irradiated on the part other than an electrode connecting part 9a for connecting the SV type MR device 8 and a back end electrode 9, and resist trestles for supporting a resist bridge part in the mask pattern described later. At this time, a part to which an electron beam is not irradiated (hereinafter referred to as an electron beam non-irradiated part) is narrower than the electrode connecting part 9a. In FIG. 4, the part irradiated with an electron beam is shown by the hatched portion.

The resist trestle herein is for forming a resist bridge part in the mask pattern, and when the MR head part 3 is finally formed, the resist trestles become unnecessary. As described later, after forming the MR head part 3 and an inductive magnetic head part 4, the substrate 5 is cut along the line $X_3$-$X_4$, followed by being polished. That is, the cut surface on the line $X_3$-$X_4$ becomes an ABS (air bearing surface) of the thin film magnetic head 1. The resist trestles are formed substantially symmetrically to the electrode connecting part 9a with respect to the SV type MR device 8.

Figure 5:
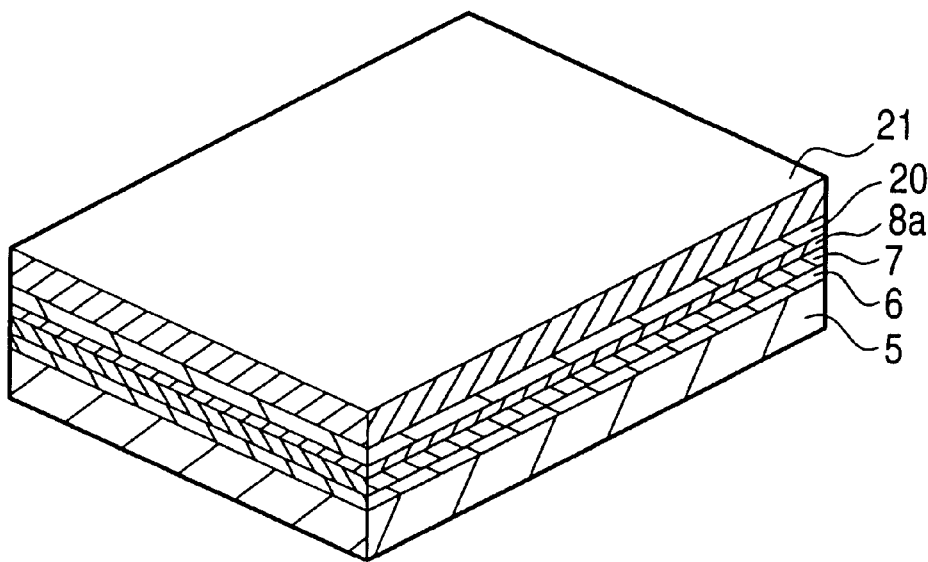
FIG. 5 is a cross sectional perspective view showing one embodiment of the process for forming a mask pattern, in which the second resist is coated on the first resist.

While rotating the substrate 5, shown in FIG. 5, at, for example, about 3,000 rpm, a second resist 21 is coated on the first resist 20, in which the pattern latent image is formed, to a thickness of, for example, about 0.6 μm. As the second resist 21, a positive electron beam resist is preferably used as similar to the first resist 20. Specific examples of the positive electron beam resist for the second resist 21 include ZEP-520 (a trade name, produced by Nippon Zeon Co., Ltd.).

The second resist 21 coated on the first resist 20 is then subjected to pre-baking before exposure. The pre-baking is conducted by using a clean oven in an air atmosphere at a temperature of from 150 to 170° for about 30 minutes.

Figure 6:
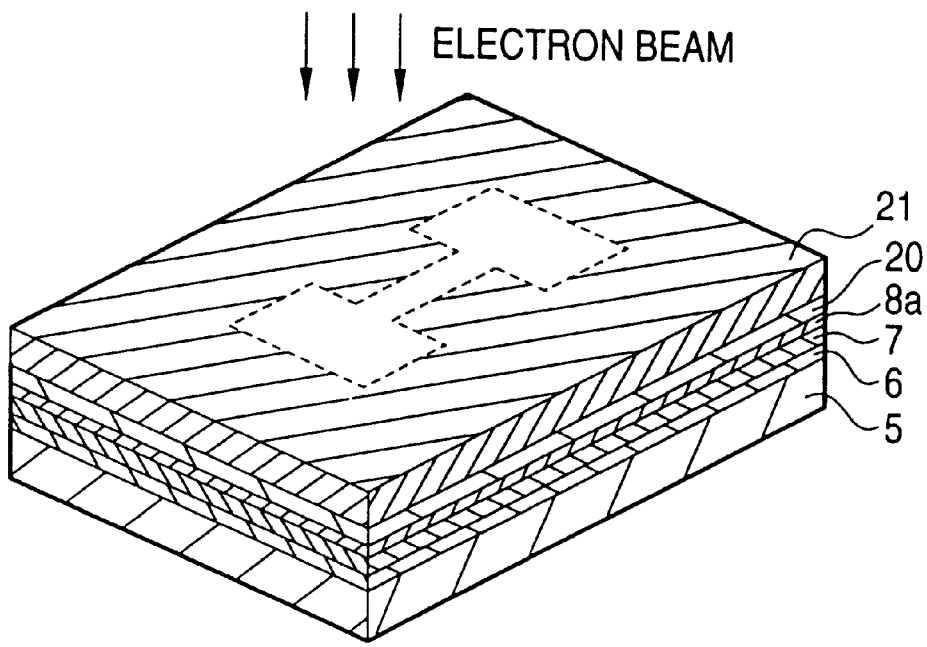
FIG. 6 is a cross sectional perspective view showing one embodiment of the process for forming a mask pattern, in which the second resist is exposed.

As shown in FIG. 6, a prescribed pattern is written on the second resist 21 by irradiating an electron beam by, for example, an electron beam exposing apparatus to form a pattern latent image in the second resist 21. Specifically, an electron beam is irradiated on the part other than the SV type MR device 8, the electrode connecting part 9a and the resist trestles. In FIG. 6, the part irradiated with an electron beam is shown by the hatched portion.

The first resist 20 and the second resist 21 each having the prescribed pattern latent images therein are then developed to form a prescribed mask pattern.

Figure 7:
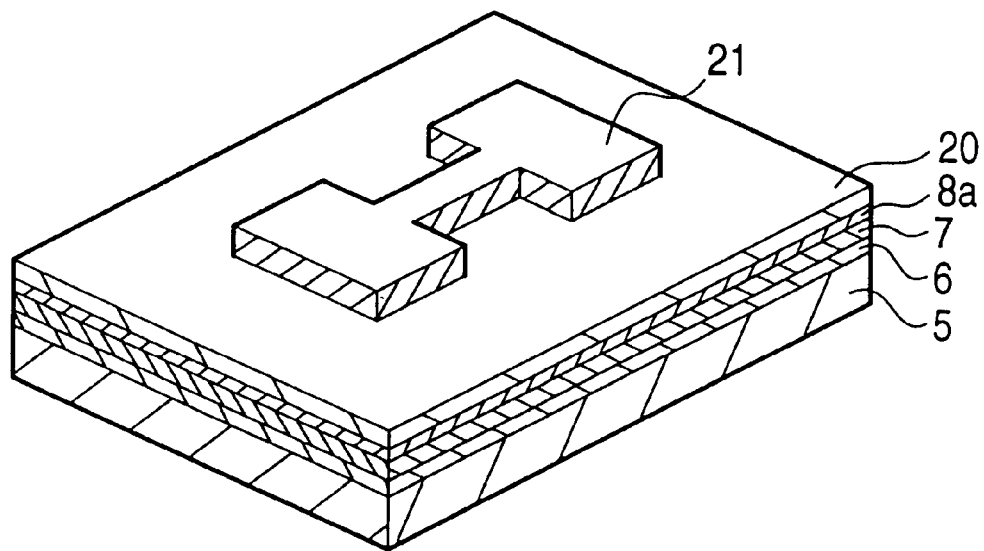
FIG. 7 is a cross sectional perspective view showing one embodiment of the process for forming a mask pattern, in which the second resist is developed.

The second resist 21 is then developed as shown in FIG. 7 to form an upper layer mask pattern. As a developer for developing the second resist 21, a developer that has a large power of dissolving the second resist 21 but does substantially not dissolve the first resist 20 is preferably used. Specifically, in the case where OEBR-1000 is used as the first resist 20, and ZEP-520 is used as the second resist 21, dimethyl formamide, for example, is used as the developer for the second resist 21. ZEP-520 is a positive resist, in which the solubility of a part irradiated with an electron beam to the developer is increased. Therefore, the part of the resist irradiated with an electron beam is removed by dissolving in the developer, and the part of the resist not irradiated with an electron beam remains, so as to form the upper layer mask pattern.

The development of the second resist 21 is conducted by immersing the substrate 5 in the developer for about 2 minutes, and then immersed in a rinsing solution for about 20 seconds. The liquids attached to the substrate 5 are removed by blowing $N_2$ on the substrate 5 to dry the substrate 5. By developing the second resist 21, the part of the resist to be the SV type MR device 8, the electrode connecting part 9a and the resist trestles remains to form the upper layer mask pattern.

Figure 8:
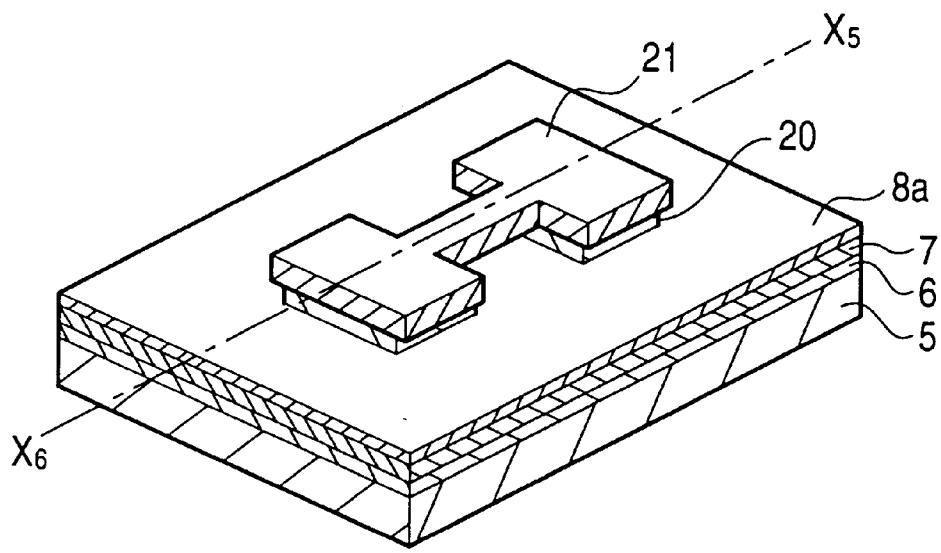
FIG. 8 is a cross sectional perspective view showing one embodiment of the process for forming a mask pattern, in which the first resist is developed.
Figure 9:
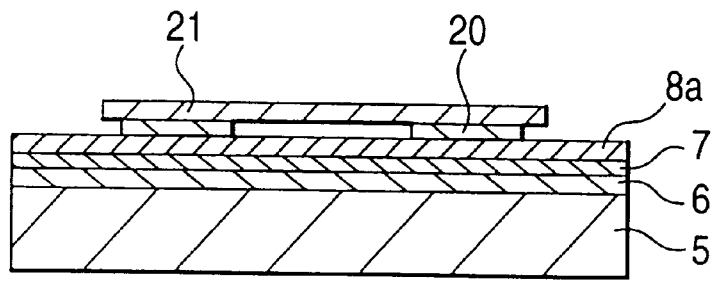
FIG. 9 is a cross sectional view taken on line $X_5$-$X_6$ in FIG. 8.

The first resist 20 is then developed to form the lower layer mask pattern as shown in FIGS. 8 and 9. FIG. 9 is a cross sectional view taken on line $X_5$-$X_6$ in FIG. 8. As the developer for developing the first resist 20, a developer that has a large power of dissolving the first resist 20 but does substantially not dissolve the second resist 21 is preferably used. Specifically, in the case where OEBR-1000 is used as the first resist 20, and ZEP-520 is used as the second resist 21, methyl ethyl ketone, for example, is used as the developer for the first resist 20. OEBR-1000 is also a positive resist, and the part of the resist not irradiated with an electron beam remains to form the lower layer mask pattern.

The development of the first resist 20 is conducted by immersing the substrate 5 in the developer for about 4 minutes, followed by washing with water for about 1 minute. The liquids attached to the substrate 5 are removed by blowing $N_2$ on the substrate 5, and the substrate 5 is dried by heating in a clean oven at 50° C. for 30 minutes.

By developing the first resist 20, the part of the resist to be the electrode connecting part 9a and the resist trestles remains to form the lower layer mask pattern. At this time, the remaining resist has the similar shape as the part to be the electrode connecting part 9a and has an area narrower than the electrode connecting part 9a.

As shown in FIG. 9, the resist of the part to be the SV type MR device 8 is removed in the lower layer mask pattern, but the resist of the part to be the SV type MR device 8 is not removed in the upper layer mask pattern. Therefore, a space is formed between the resist of the upper layer mask pattern remaining at the part to be the SV type MR device 8 and the SV film 8a, and the resist remaining at the part to be the SV type MR device 8 floats above the SV film 8a.

Figure 10:
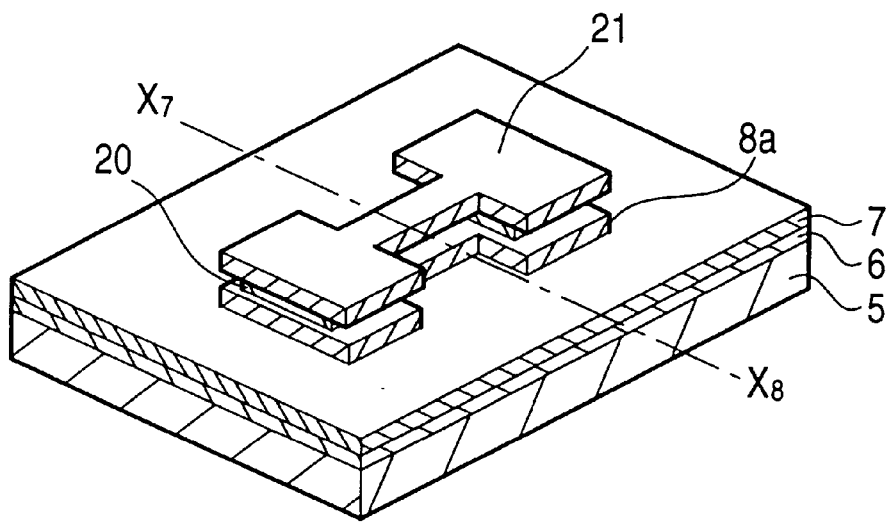
FIG. 10 is a cross sectional perspective view showing one embodiment of the process for forming a mask pattern, in which the SV film exposed from the mask pattern is etched.
Figure 11:
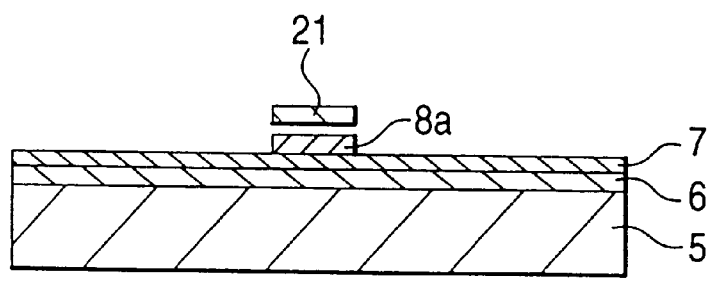
FIG. 11 is a cross sectional view taken on line $X_7$-$X_8$ in FIG. 10.

As shown in FIGS. 10 and 11, etching is conducted by using the mask pattern thus formed as a mask to remove the SV film 8a exposed from the mask pattern. FIG. 11 is a cross sectional view taken on line $X_7$-$X_8$ in FIG. 10. The etching is conducted by ion etching, for example.

When the mask pattern is formed in contact with the SV film 8a in the part to be the SV type MR device 8, the SV film removed by etching is re-attached to the side surface of the resist. When the SV film is re-attached to the side surface of the resist, burr is formed on the SV type MR device 8 due to the re-attached matters on removing the resist. The burr formed on the SV type MR device 8 becomes reasons of lowering of the reproducing sensitivity of the MR head part 3 and deterioration of yield.

According to the process for forming a mask pattern of the invention, the resist remaining in the part to be the SV type MR device 8 floats above the SV film 8a. Therefore, there is no side surface of the resist, to which the SV film removed by etching is to be attached, immediately on the part to be the device. Even when the SV film removed by etching is attached to the resist remaining above the part to be the SV type MR device 8, the resist is not in contact with the SV film 8a, and there is no problem of forming burr on removing the resist from the SV type MR device 8.

Furthermore, in the mask pattern, the resist remaining part of the upper layer mask pattern is larger than the resist remaining part of the lower layer mask pattern. In other words, on the circumference of the mask pattern, the second resist 21 protrudes from the first resist pattern 20. The protruding second resist 21 is not in contact with the SV film 8a. Therefore, even when the SV film removed by etching is re-attached to the protruding second resist 21, there is no problem of forming burr on removing the resist from the SV type MR device 8 because that part of the resist is not in contact with the SV film 8a.

It is preferred that the incident angle of an ion beam for conducting etching is perpendicular to the substrate 5. By irradiating the substrate 5 with the ion beam from the direction perpendicular to the substrate 5, the re-attachment of the SV film removed by etching to the resist can be prevented.

Figure 12:
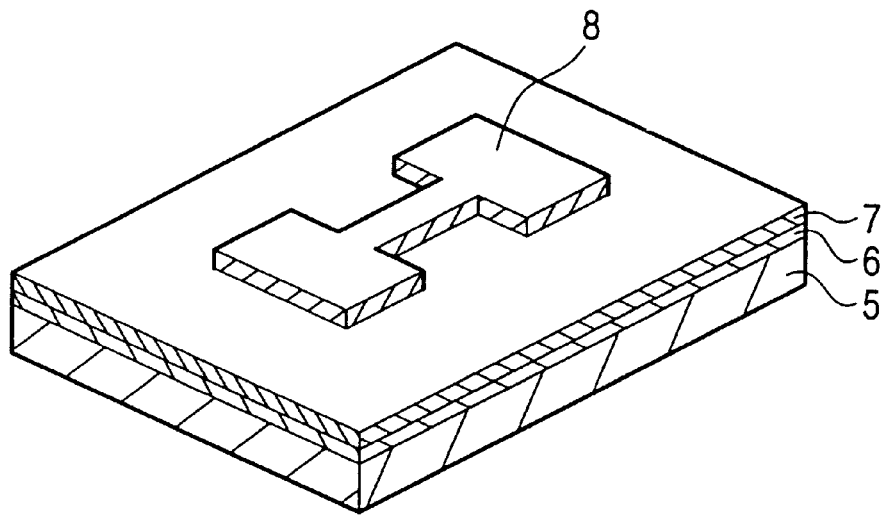
FIG. 12 is a cross sectional perspective view showing one embodiment of the process for forming a mask pattern, in which the resist is removed.

Finally, by removing the resist as shown in FIG. 12, the SV type MR device 8 and the electrode connecting part 9a are formed in the prescribed shapes. In order to remove the resist, a remover solvent for the respective resist is used with applying an ultrasonic vibration. As the remover solvent for removing the resist, in the case where OEBR-1000 is used as the first resist 20, methyl ethyl ketone can be used for removing the first resist 20. In the case where ZEP-520 is used as the second resist 21, dimethylformamide can be used far removing the second resist 21.

In the embodiment described in this example, the mask pattern has a two-layer structure, in which the resist remaining part above the part to be the SV type MR device 8 is formed as floating from the spin valve film, and therefore even when re-attached matters to the resist are formed on etching, the formation of burr in the SV type MR device 8 on removing the resist can be suppressed.

An insulating film 11 not shown in the figure is laminated on the SV type MR device 8 and a back end electrode 9, and a front end electrode 10 is formed on the front end of the insulating layer 11. An upper magnetic layer 12 is then formed on the front end electrode 10 to complete the MR head part 3. An inductive magnetic head part 4 is then formed on the MR head part 3. Polishing is conducted until one end in the longitudinal direction of the SV type MR device 8 is exposed on the ABS surface, followed by cutting the substrate into the respective magnetic head, to complete the thin film magnetic head 1.

Figure 13:
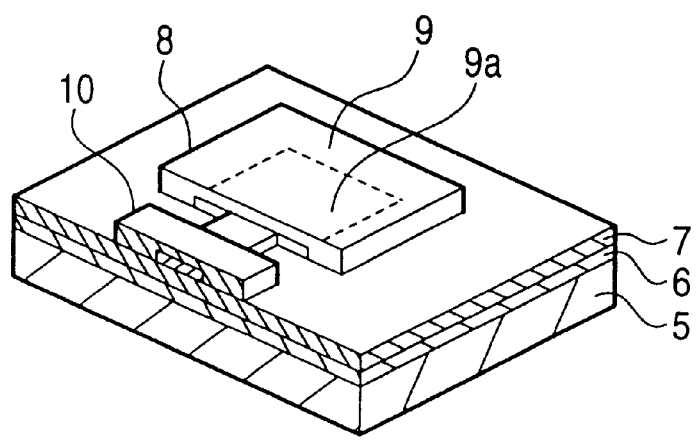
FIG. 13 is a cross sectional perspective view showing the back end electrode and the front end electrode are formed in the SV type MR device.

FIG. 13 shows the state in that the back end electrode 9 and the front end electrode 10 are connected to the SV type MR device 8. In FIG. 13, the insulating layer 11 of the MR head part 3 and the inductive magnetic head part 4 are omitted. As shown in FIG. 13, one end of the longitudinal direction of the substantially rectangular SV type MR device 8 is exposed on the ABS surface, and the front end electrode 10 is formed, with the back end electrode 9 being connected to the electrode connecting part 9a on the other end of the SV type MR device 8.

EMBODIMENT 2

Another preferred embodiment of the invention will be described below.

Figure 14:
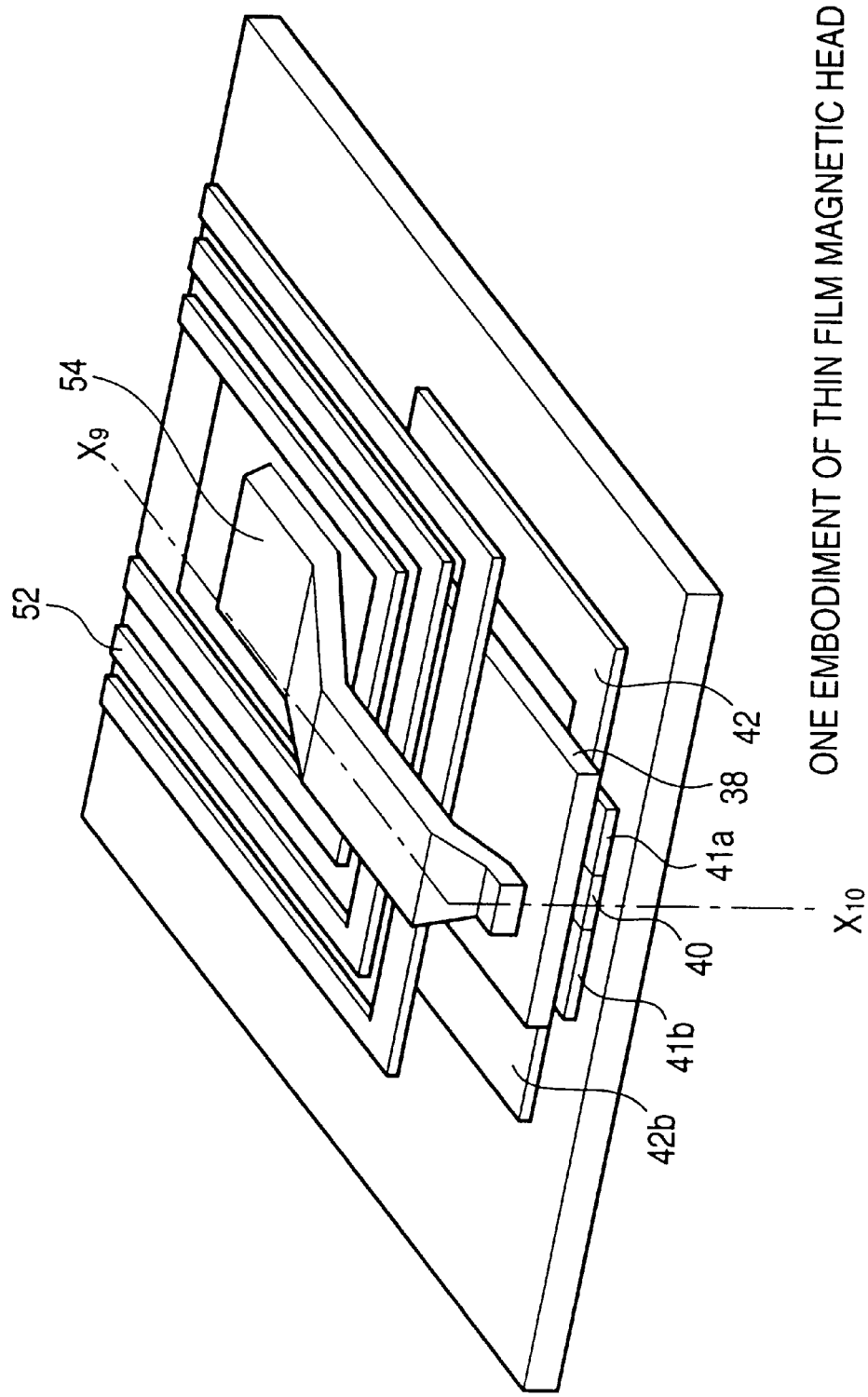
FIG. 14 is a perspective view showing an important part of another embodiment of the thin film magnetic head produced by applying the invention.
Figure 15:
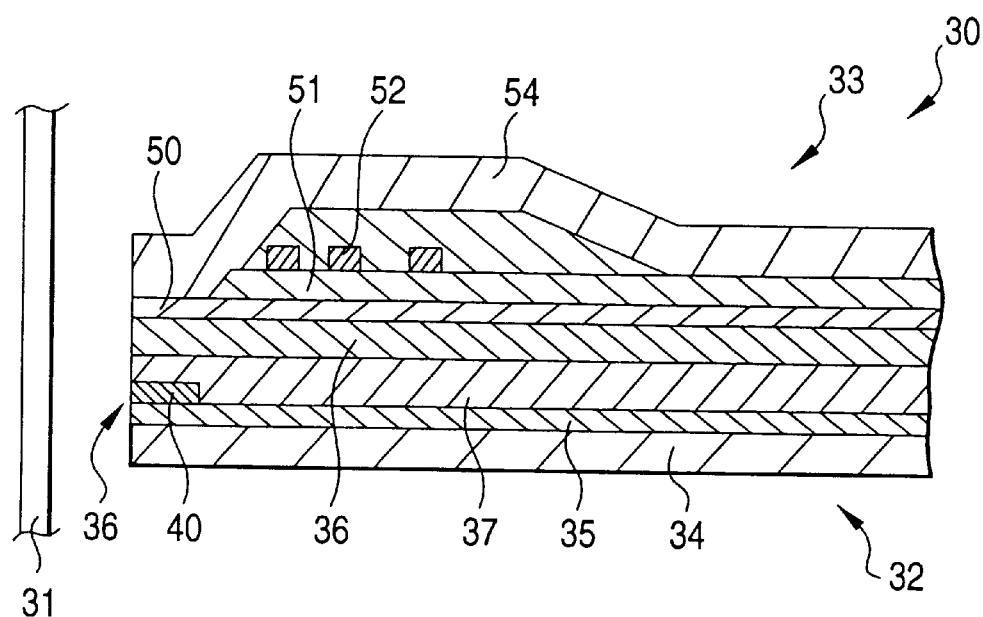
FIG. 15 is a cross sectional view taken on line $X_9$-$X_{10}$ in FIG. 14.

FIGS. 14 and 15 show one embodiment of a thin film magnetic head 30 produced by applying the invention. FIG. 14 is a perspective view showing an important part of the thin film magnetic head 30, and FIG. 15 is a cross sectional view taken on line $X_9$-$X_{10}$ in FIG. 14. The thin film magnetic head 30 comprises an MR head part 32 reproducing an information signal from a magnetic recording medium 31 and an inductive magnetic head part 33 recording an information signal on the magnetic recording medium 31.

The MR head part 32 comprises a substrate 34, a first insulating film 35 formed on the substrate 34, an MR head device 36 formed on the first insulating film 35, a second insulating film 37 formed on the MR head device 36, and a soft magnetic layer 38 formed on the second insulating film 37.

The substrate 34 becomes a lower layer shield of the MR head part 32. As the substrate 34, a soft magnetic material of hard nature, such as Ni—Zn ferrite and Mn—Zn ferrite, is used. The first insulating film 35 becomes a lower layer gap of the MR head part 32, and the second insulating film 37 becomes an upper layer gap of the MR head part 32.

The soft magnetic layer 38 becomes an upper shield of the MR head part 32. The soft magnetic layer 38 also functions as a lower magnetic core of the inductive magnetic head part 33.

The MR head device 36 is sandwiched by the substrate 34 and the soft magnetic layer 38 via the first insulating film 35 and the second insulating film 37.

Figure 16:
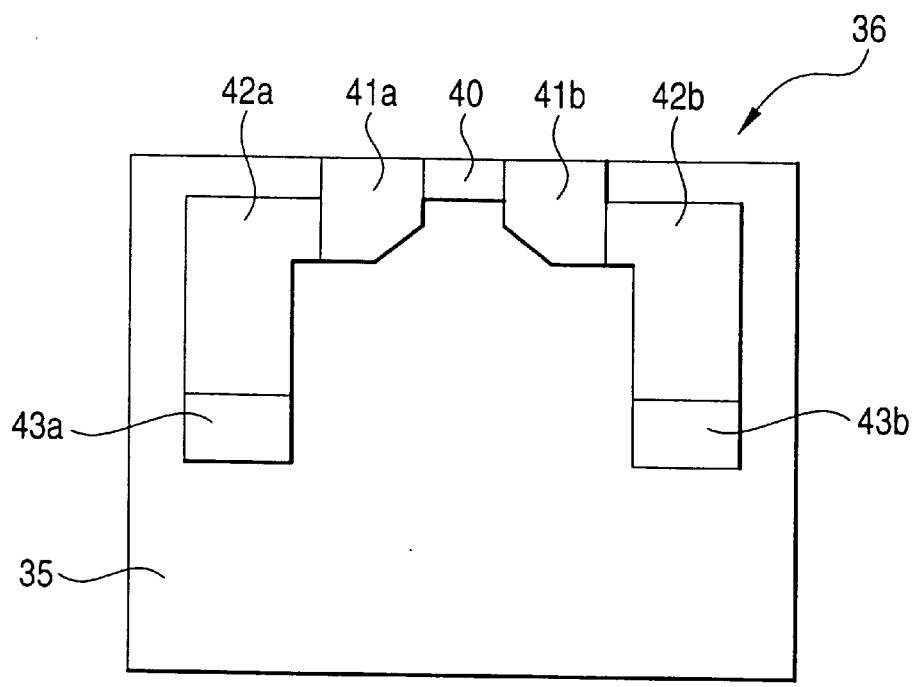
FIG. 16 is a plan view showing one embodiment of the SV type MR head used device in the thin film magnetic head shown in FIGS. 14 and 15.

FIG. 16 is a plan view of one embodiment of the MR head device 36 used in the MR head part 32. The MR head device 36 comprises a substantially rectangular SV type MR device 40 arranged in such a manner that the longitudinal direction of the SV type MR device 40 is substantially parallel to a plane facing the magnetic recording medium 31, permanent magnet films 41a and 41b formed on both ends of the longitudinal direction of the SV type MR device 40, leader conductors 42a and 42b withdrawn from the permanent magnet films 41a and 41b, an external terminal 43a formed on one end of the leader conductor 42a, and an external terminal 43b formed on one end of the leader conductor 42b.

The SV film comprises, for example, a free layer, a non-magnetic layer, a pin layer and an antiferromagnetic layer laminated in this order. In the SV film, the magnetization direction of the free layer is rotated by an external magnetic field. The resistance of the SV film is changed depending on the angle formed by the magnetization direction of the free layer and the magnetization direction of the pin layer. Therefore, in the SV type MR device 40, the detection of the external magnetic field is conducted by utilizing the change in resistance of the SV film. The MR head part 32 is a so-called horizontal MR head, in which the longitudinal direction of the SV type MR device 40 is substantially parallel to the plane facing the magnetic recording medium 31.

The permanent magnet films 41a and 41b are formed on both ends of the longitudinal direction of the SV type MR device 40 to fix the magnetization direction of the free layer constituting the SV type MR device 40 by the influence of the magnetic field from the permanent magnet films 41a and 41b. The magnetization distribution of the free layer is stabilized to a single magnetic domain condition, and the magnetoresistance characteristics of the SV type MR device 40 can be stabilized without hysteresis. As the permanent magnet films 41a and 41b, so-called ferrite, such as one represented by the general formula ($MO-Fe_2O_3$, wherein M is a divalent metallic ion), is employed.

In the MR head part 32, because the permanent magnet films 41a and 41b have conductivity, a sense electric current is supplied from the leader conductors 42a and 42b through the permanent magnet films 41a and 41b to the SV type MR device 40. A magneto-sensitive part actually detecting the magnetic field from the magnetic recording medium 31 is the SV type MR device 40 provided between the permanent magnet films 41a and 41b. Therefore, the distance between the permanent magnet films 41a and 41b is a track width, and the track width is restricted by the permanent magnet films 41a and 41b.

The leader conductors 42a and 42b comprise conductive films, which are electrodes for supplying a sense electric current to the SV type MR device 40 and the permanent magnet films 41a and 41b. One end of each of the leader conductors 42a and 42b is connected to each of the permanent magnet films 41a and 41b, and a sense electric current is supplied through the leader conductors 42a and 42b to the permanent magnet films 41a and 41b and the SV type MR device 40. External terminals 43a and 43b are formed on the other ends of the leader conductors 42a and 42b.

When a recorded signal is read from the magnetic recording medium 31 by using the MR head part 32, a sense electric current is supplied from the external terminals 43a and 43b formed on the ends of the leader conductors 42a and 42b to the SV type MR device 40 through the leader conductors 42a and 42b, and the sense electric current is passed in the longitudinal direction of the SV type MR device 40. The change in resistance of the SV type MR device 40 formed by the magnetic field from the magnetic recording medium 31 is detected by the sense electric current, so as to reproduce the recorded signal of the magnetic recording medium 31.

The inductive magnetic head part 33 comprises a soft magnetic layer 38 also functioning as a lower magnetic core, a gap film 50 to be a magnetic gap formed on the soft magnetic layer 38, a first flattening layer 51 formed on the gap film 50, a conductor coil 52 formed in a spiral form on the first flattening layer 51, a second flattening layer 53 formed on the conductor coil 52, and an upper magnetic core 54 comprising a soft magnetic material formed on the second flattening layer 53.

In the inductive magnetic head part 33, a closed magnetic circuit is formed by the soft magnetic layer 38 (lower magnetic core) and the upper magnetic core 54. Therefore, in the inductive magnetic head part 33, difference in magnetic potential between the lower magnetic core and the upper magnetic core 54, and a magnetic flux caused by the difference in magnetic potential effectively crosses an electric current passing through the conductor coil 52, to conduct application of a recording magnetic field to the magnetic recording medium 31.

A process for producing the thin film magnetic head 30 will be described below.

An MR head part 32 is produced. A substrate 34 is prepared, and the surface thereof is mirror-polished. As the substrate 34, a soft magnetic material having hard nature is used. A first insulating film 35 to be a lower layer gap is formed on the substrate 34 by sputtering, for example. As the material of the first insulating film 35, $Al_2O_3$ is used, for example. An SV film 40a to be an SV type MR device 40 is formed on the first insulating film 35.

Permanent magnet films 41a and 41b are formed on both ends of the part to be the SV type MR device 40. In order to form the permanent magnet films 41a and 41b, a resist is coated on the SV film 40a, and a mask pattern, in which the resist is removed only in parts to be the permanent magnet films 41a and 41b, is formed by a photolithography process. The process for forming the mask pattern will be described in more detail later.

Etching is conducted by using the mask pattern as a mask to remove the SV film 40a exposed from the mask. The etching is conducted, for example, by ion etching. While the mask pattern remains, a permanent magnet film is formed on the whole surface, for example, by sputtering. Finally, the resist is removed along with the permanent magnet film formed on the resist to obtain a state in that the permanent magnet films 41a and 41b are embedded in the SV film 40a.

Leader conductors 42a and 42b for supplying a sense electric current to the SV type MR device 40 are formed. Specifically, a resist is coated on the SV film, and a mask pattern, in which the resist is removed only on parts to be the leader conductors 42a and 42b, is formed by a photolithography process. Etching is conducted by using the mask pattern as a mask to remove the SV film 40a on the parts to be the leader conductors 42a and 42b exposed from the mask. The etching is conducted, for example, by ion etching.

After removing the SV film 40a on the parts to be the leader conductors 42a and 42b, a conductive film is grown with the mask pattern remaining. The resist is then removed along with the conductive film formed on the resist to obtain a state in that the conductive film is formed on the part to be the leader conductors 42a and 42b.

A second insulating film 37 to be an upper layer gap is then formed, for example, by sputtering. As the material of the second insulating film 37, for example, $Al_2O_3$ is used.

A soft magnetic layer 38 to be an upper layer shield is then formed at the prescribed position, for example, by a pattern plating method. As the material of the soft magnetic layer 38, for example, NiFe is used. The MR head part 32 is thus completed through the steps described above.

An inductive magnetic head part 33 is then produced. A gap film 50 is formed on the soft magnetic layer 38 also functioning as a lower magnetic core of the inductive magnetic head part 33. A first flattening layer 51 comprising a polymer material, for example, is formed on the gap film 50, by which the surface of the gap film is flattened to form a conductor coil 52 in a precise manner.

The conductor coil 52 is formed on the first flattening layer 51 by a pattern plating method or ion etching. The conductor coil 52 may comprise a conductive material, such as Cu.

A second flattening layer 53 is then formed on the conductor coil, and the surface of the second flattening layer 53 is polished to be flattened.

An upper magnetic core 54 is formed on the second flattening layer 53 by sputtering, and the upper magnetic core 54 is formed into a prescribed shape by etching.

The inductive magnetic head part 33 is formed through the process described above to complete the thin film magnetic head 30.

The process for forming the mask pattern for forming the SV type MR device 40 and the permanent magnet films 41a and 41b of the MR head part 32 will be described in more detail with reference to FIGS. 17 to 29.

Figure 17:
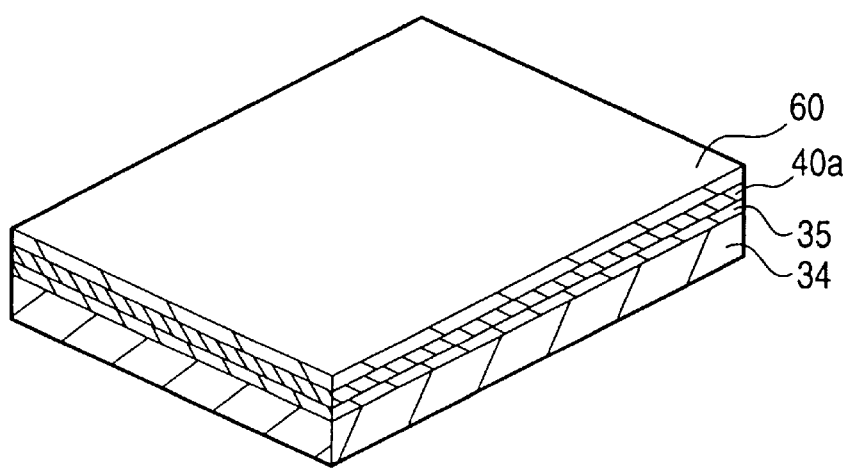
FIG. 17 is a cross sectional perspective view showing another embodiment of the process for forming a mask pattern, in which the first resist is coated on the SV film.

While rotating a substrate 34 having formed thereon a first insulating film 35 and an SV film 40a to be the SV type MR device 40, as shown in FIG. 17, for example, at about 3,000 rpm, a first resist 60 is coated on the SV film 40a to a thickness of, for example, about 0.2 $\mu$m. As the first resist 60, an electron beam resist can be used. The first resist 60 is preferably a positive resist, a part of which irradiated with an electron beam suffers increase in solubility to a developer. Specific examples of the positive electron beam resist include OEBR-1000 (a trade name, produced by Tokyo Ohka Kogyo Co., Ltd.).

The first resist 60 coated on the SV film 40a is subjected to pre-baking before exposure. By conducting pre-baking, the sensitivity of the first resist 60 is increased to form a fine pattern in a precise manner. The pre-baking is conducted by using a clean oven in an air atmosphere at a temperature of from 180 to 200° C. for about 30 minutes.

Figure 18:
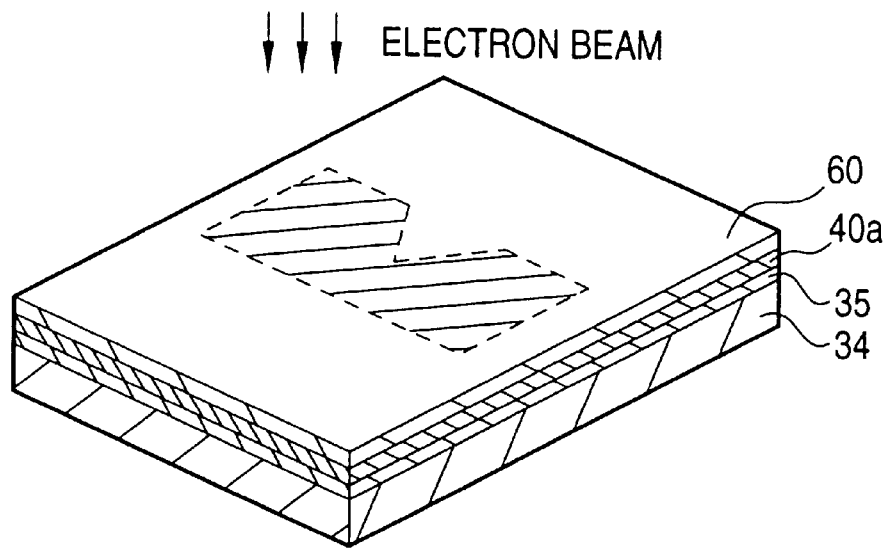
FIG. 18 is a cross sectional perspective view showing another embodiment of the process for forming a mask pattern, in which the first resist is exposed.

As shown in FIG. 18, a prescribed pattern is written on the first resist 60 by irradiating with an electron beam by, for example, an electron beam exposing apparatus to form a pattern latent image in the first resist 60. In FIG. 18, the part irradiated with an electron beam is shown by the hatched portion.

Specifically, an electron beam is irradiated on the part to be the SV type MR device 40 and the permanent magnetic films 41a and 41b. At this time, a part irradiated with an electron beam is wider than the part to be the SV type MR device 40 and the permanent magnet films 41a and 41b.

Figure 19:
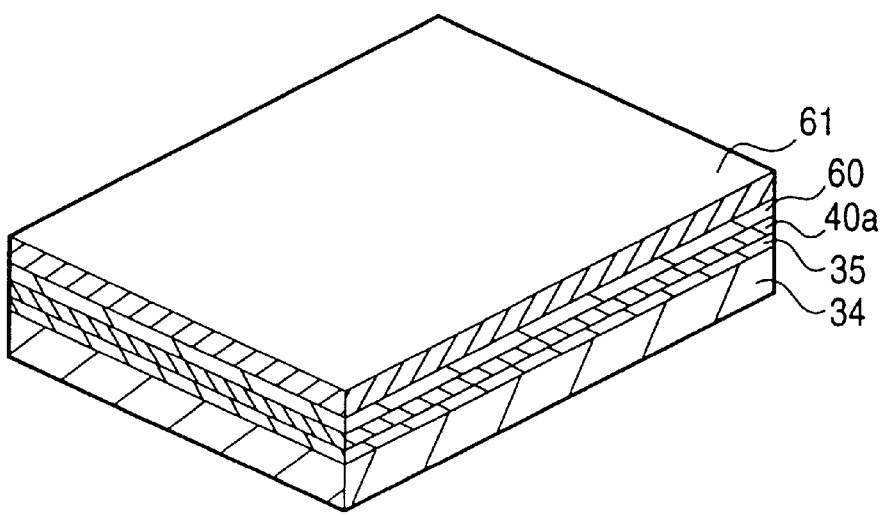
FIG. 19 is a cross sectional perspective view showing another embodiment of the process for forming a mask pattern, in which the second resist is coated on the first resist.

While rotating the substrate 34 at about 3,000 rpm, for example, a second resist 61 is coated to a thickness of, for example, about 0.6 $\mu$m, on the first resist 60, in which the pattern latent image has been formed, as shown in FIG. 19. The second resist 61 is preferably a positive electron beam resist as similar to the first resist 60. Specific examples of the positive electron beam resist for the second resist 61 include ZEP-520 (a trade name, produced by Nippon Zeon Co., Ltd.).

The second resist 61 coated on the first resist 60 is then subjected to pre-baking before exposure. The pre-baking is conducted by using a clean oven in an air atmosphere at a temperature of from 150 to 170° for about 30 minutes.

Figure 20:
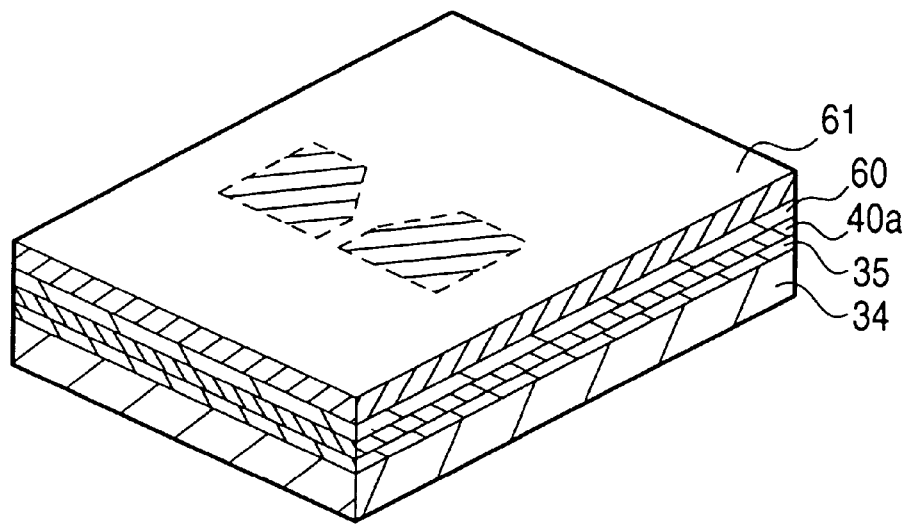
FIG. 20 is a cross sectional perspective view showing another embodiment of the process for forming a mask pattern, in which the second resist is exposed.

As shown in FIG. 20, a prescribed pattern is written on the second resist 61 by irradiating an electron beam by, for example, an electron beam exposing apparatus to form a pattern latent image in the second resist 61. Specifically, an electron beam is irradiated on the parts to be the permanent magnet films 41a and 41b arranged at both ends of the longitudinal direction of the MR head device 36. In FIG. 20, the parts irradiated with an electron beam are shown by the hatched portion.

The first resist 60 and the second resist 61 each having the prescribed pattern latent images therein are then developed to form a prescribed mask pattern.

Figure 21:
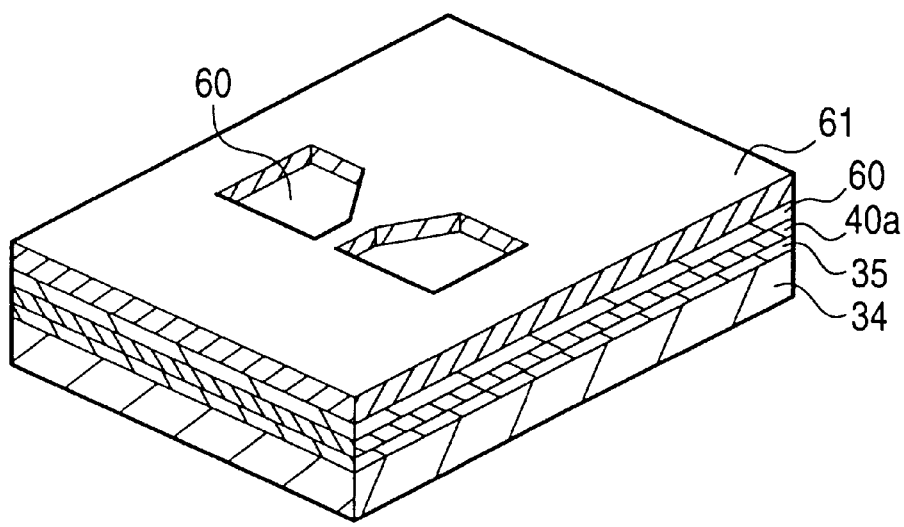
FIG. 21 is a cross sectional perspective view showing another embodiment of the process for forming a mask pattern, in which the second resist is developed.

The second resist 61 is then developed as shown in FIG. 21 to form an upper layer mask pattern. As a developer for developing the second resist 61, a developer that has a large power of dissolving the second resist 61 but does substantially not dissolve the first resist 60 is preferably used. Specifically, in the case where OEBR-1000 is used as the first resist 60, and ZEP-520 is used as the second resist 61, dimethyl formamide, for example, is preferably used as the developer for the second resist 61. ZEP-520 is a positive resist, in which the solubility of a part irradiated with an electron beam to the developer is increased. Therefore, the part of the resist irradiated with an electron beam is removed by dissolving in the developer, and the part of the resist not irradiated with an electron beam remains, so as to form the upper layer mask pattern.

The development is conducted by immersing the substrate 34 in the developer for about 2 minutes, and then immersed in a rinsing solution for about 20 seconds. The liquids attached to the substrate 34 are removed by blowing $N_2$ on the substrate 34 to dry the substrate 34. By developing the second resist 61, the parts of the resist to be the permanent magnet films 41a and 41b remain to form the upper layer mask pattern having openings at the parts to be the permanent magnet films 41a and 41b.

Figure 22:
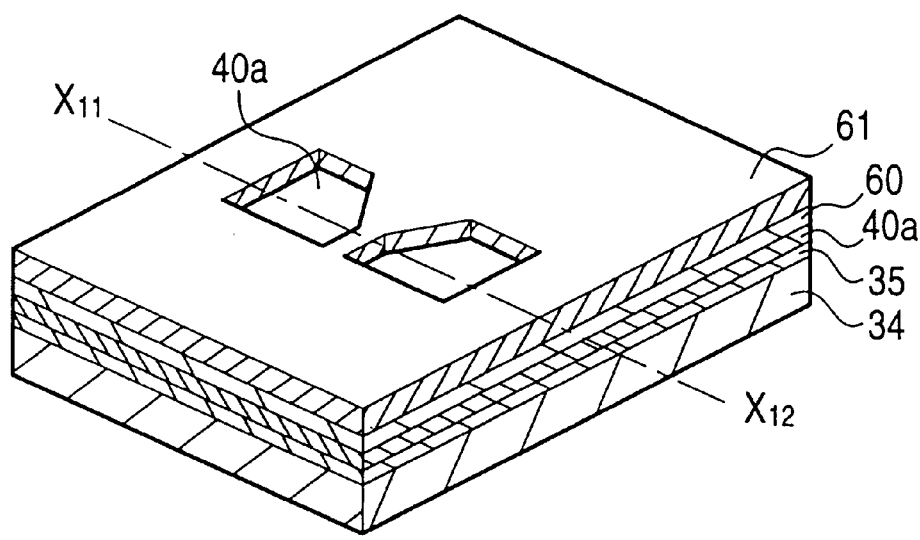
FIG. 22 is a cross sectional perspective view showing another embodiment of the process for forming a mask pattern, in which the first resist is developed.
Figure 23:
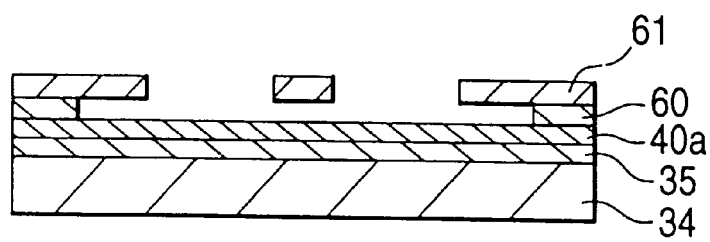
FIG. 23 is a cross sectional view taken on line $X_{11}$-$X_{12}$ in FIG. 22.

The first resist 60 is then developed to form the lower layer mask pattern as shown in FIGS. 22 and 23. FIG. 23 is a cross sectional view taken on line $X_{11}$-$X_{12}$ in FIG. 22. As the developer for developing the first resist 60, a developer that has a large power of dissolving the first resist 60 but does substantially not dissolve the second resist 61 is preferably used. Specifically, in the case where OEBR-1000 is used as the first resist 60, and ZEP-520 is used as the second resist 61, methyl ethyl ketone, for example, is used as the developer for the first resist 60. OEBR-1000 is also a positive resist, and the part of the resist not irradiated with an electron beam remains to form the lower layer mask pattern.

The development is conducted by immersing the substrate 34 in the developer for about 4 minutes, followed by washing with water for about 1 minute. The liquids attached to the substrate 34 are removed by blowing $N_2$ on the substrate 34, and the substrate 34 is dried by heating in a clean oven at 50° C. for 30 minutes.

By developing the first resist 60, the part of the resist to be the permanent magnet films 41a and 41b is dissolved to form the lower layer mask pattern having opening at the part to be the SV type MR device 40 and the permanent magnet films 41a and 41b, the opening having a size larger than the part to be the SV type MR device 40 and the permanent magnet films 41a and 41b.

The SV type MR device 40 is formed between the permanent magnet films 41a and 41b. The lower layer mask pattern has an opening at a part to be the SV type MR device 40 and the permanent magnet films 41a and 41b. The upper layer mask pattern formed on the lower layer mask pattern has openings at the parts to be the permanent magnet films 41a and 41b. That is, in the lower layer mask pattern, the resist at the part to be the SV type MR device 40 is removed. In the upper layer mask pattern, on the other hand, the resist at the part to be the SV type MR device 40 remains. Therefore, in the upper layer mask pattern, the resist at the part to be the SV type MR device 40 bridges the first resist 60, and a space is present between the remaining resist and the SV film 40a in the part to be the SV type MR device 40. In other words, the resist remaining at the part to be the SV type MR device 40 floats above the SV film 40a.

Figure 24:
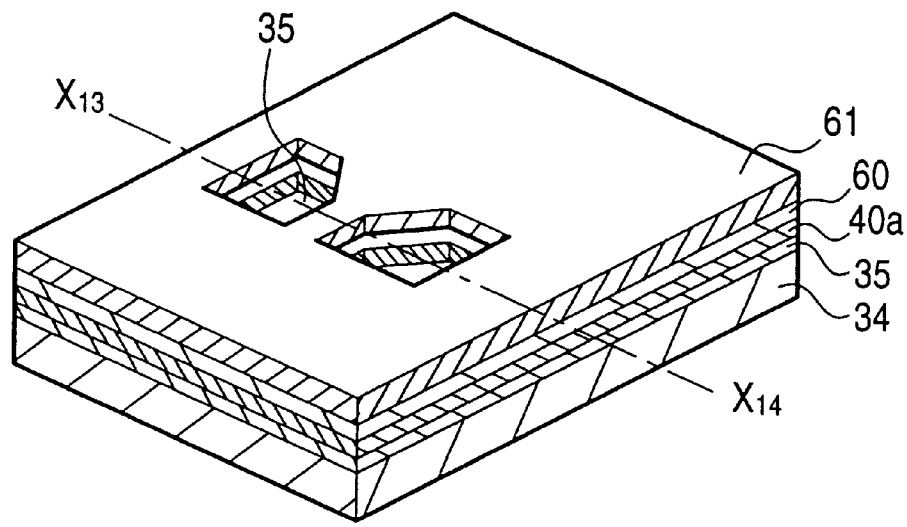
FIG. 24 is a cross sectional perspective view showing another embodiment of the process for forming a mask pattern, in which the SV film exposed from the mask pattern is etched.
Figure 25:
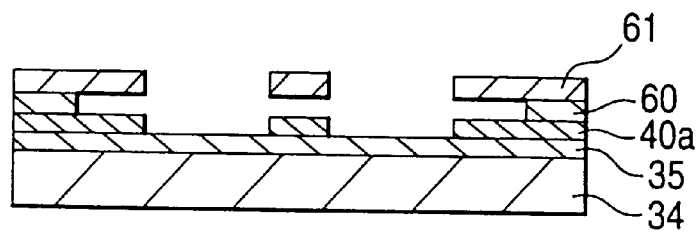
FIG. 25 is a cross sectional view taken on line $X_{13}$-$X_{14}$ in FIG. 24.

As shown in FIGS. 24 and 25, etching is conducted by using the mask pattern thus formed as a mask to remove the SV film 40a exposed from the mask pattern. FIG. 25 is a cross sectional view taken on line $X_{13}$-$X_{14}$ in FIG. 24. The etching is conducted by ion etching, for example.

When the mask pattern is formed in contact with the SV film 40a in the part to be the SV type MR device 40, the SV film removed by etching is re-attached to the side surface of the resist. When the SV film is re-attached to the side surface of the resist, burr is formed on the SV type MR device 40 due to the re-attached matters on removing the resist. The burr formed on the SV type MR device 40 becomes reasons of lowering of the reproducing sensitivity of the MR head part 32 and deterioration of yield.

According to the process for forming a mask pattern of the invention, the resist remaining in the part to be the SV type MR device 40 floats above the SV film 40a. Therefore, there is no side surface of the resist, to which the SV film removed by etching is to be attached, immediately on the part to be the device. Even when the sv film removed by etching is attached to the resist remaining above the part to be the SV type MR device 40, the resist is not in contact with the SV film 40a, and there is no problem of forming burr on removing the resist from the SV type MR device 40.

Furthermore, because the opening of the lower layer mask pattern is larger than the openings of the upper layer mask pattern as shown in FIG. 25, the second resist 61 protrudes from the openings of the first resist 60 toward the inside. The remaining second resist 61 protruding from the first resist 60 is not in contact with the SV film 40a.

Therefore, even when the SV film removed by etching is re-attached to the protruding second resist 61, there is no problem of forming burr on removing the resist from the SV type MR device 40 because that part of the resist is not in contact with the SV film 40a.

It is preferred that the incident angle of an ion beam for conducting etching is perpendicular to the substrate 34. By irradiating the substrate 34 with the ion beam from the direction perpendicular to the substrate 34, the re-attachment of the SV film removed by etching to the resist can be prevented.

Figure 26:
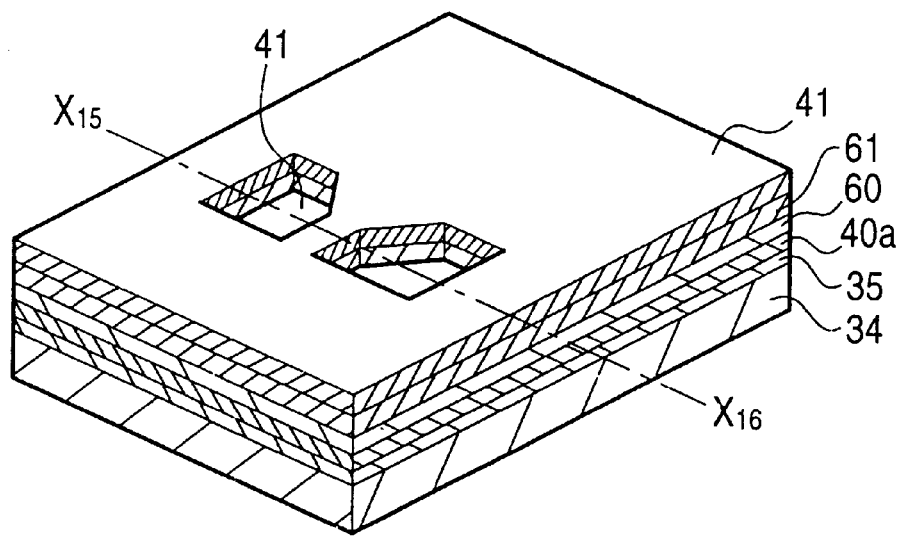
FIG. 26 is a cross sectional perspective view showing another embodiment of the process for forming a mask pattern, in which the permanent magnet film is formed on the whole surface.
Figure 27:
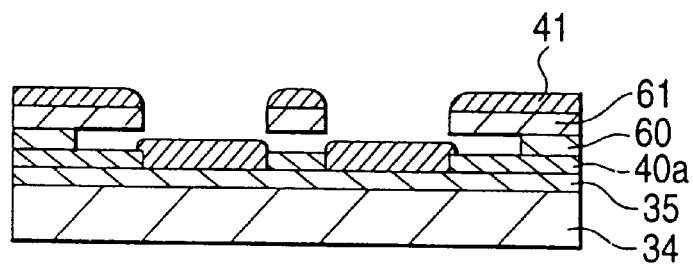
FIG. 27 is a cross sectional view taken on line $X_{15}$-$X_{16}$ in FIG. 26.

A permanent magnet film 41 is then formed, for example, by sputtering, on the whole surface with the mask pattern remaining as shown in FIGS. 26 and 27. FIG. 27 is a cross sectional view taken on line $X_{15}$-$X_{16}$ in FIG. 26.

Figure 28:
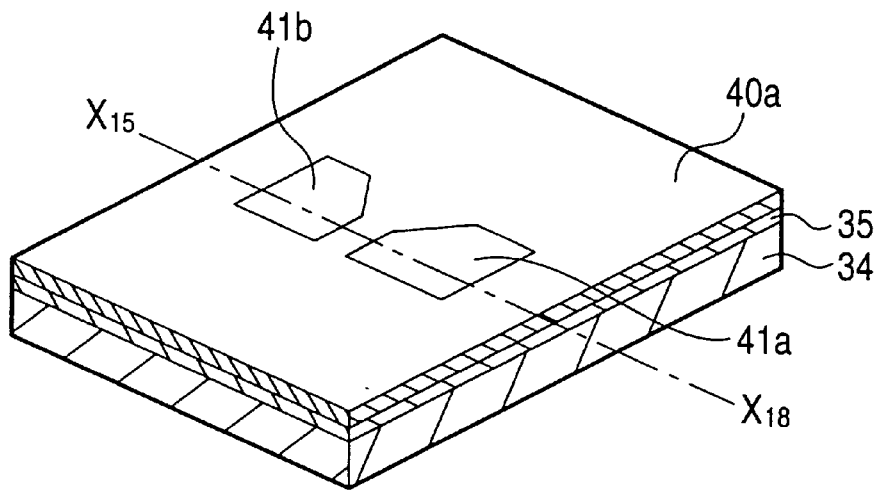
FIG. 28 is a cross sectional perspective view showing another embodiment of the process for forming a mask pattern, in which the resist is removed along with the permanent magnet film formed on the resist.
Figure 29:
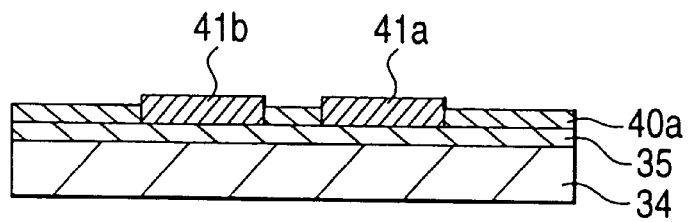
FIG. 29 is a cross sectional view taken on line $X_{17}$-$X_{18}$ in FIG. 28.

Finally, by removing the resist along with the permanent magnet film 41 formed on the resist as shown in FIGS. 28 and 29, the state in which the permanent magnet films 41a and 41b having the prescribed pattern are embedded in the SV film 40a. FIG. 29 is a cross sectional view taken on line $X_{17}$-$X_{18}$ in FIG. 28. In order to remove the resist, a remover solvent for the respective resist is used with applying an ultrasonic vibration. As the remover solvent for removing the resist, in the case where OEBR-1000 is used as the first resist 60, methyl ethyl ketone can be used for removing the first resist 60. In the case where ZEP-520 is used as the second resist 61, dimethylformamide can be used for removing the second resist 61.

When the permanent magnet film 41 is formed, for example, by sputtering, the permanent magnet film rebounding and scattering on the surface of the substrate is attached to the side surface of the resist, in addition to the permanent magnet film formed on the resist. Because the resist remaining above the part to be the SV type MR device 40 is not in contact with the SV film 40a, the formation of burr due to the permanent magnet film attached to the resist can be prevented on removing the resist along with the permanent magnet film 41 formed on the resist.

In the embodiment described in this example, the mask pattern has a two-layer structure, in which the mask formed above the part to be the SV type MR device 40 is formed as floating from the SV film 40a, and therefore even when re-attached matters to the resist are formed on etching, the formation of burr in the SV type MR device 40 on removing the mask can be suppressed.

As described in the foregoing, in the process for producing a thin film magnetic head according to the invention, the formation of burr due to the re-attached matters to the mask can be prevented when the SV type MR device of the MR head part is formed to the desired shape by etching. Therefore, the thin film magnetic head produced by applying the invention can suppress the deterioration of characteristics of the SV type MR device. By using an electron beam resist on forming the mask pattern, a fine device having a line width of 0.5 μm or less, for example, can be easily produced in a precise manner.

Furthermore, in the process for producing a thin film magnetic head according to the invention, when the permanent magnet film for stabilizing the SV type MR device is formed with the mask pattern remaining, the deterioration of characteristics of the SV type MR device due to the attached matters on the mask is prevented, and the adhesion of the SV type MR device and the permanent magnet film can be stabilized.

While an MR head using an SV film exhibiting a giant magnetoresistance effect has been described as an example in the embodiments described above, the invention is not limited thereto but can be applied to the case where an MR head using a soft magnetic film exhibiting an anisotropic magnetoresistance effect or an MR head using a device exhibiting a giant magnetoresistance effect other than the SV film are produced.

Furthermore, while an electron beam resist has been described as a resist for forming the mask pattern as an example, the invention is not limited thereto, but the invention can be applied to the case where other resists than the electron beam resist, such as a photoresist, are used.

In the process for forming a mask pattern according to the invention, the second resist is coated on the first resist, in which a prescribed pattern latent image is formed, and the second resist is exposed to form a prescribed pattern latent image in the second resist. Thereafter, the second resist is first developed to form the upper layer mask pattern, and then the first resist is developed to form the lower layer mask pattern. Therefore, in the process for forming a mask pattern according to the invention, a resist bridge part can be easily formed in the upper layer mask pattern, which provides a space between the upper layer mask pattern and the mask pattern forming surface.

Accordingly, when the mask pattern formed by the process for forming a mask pattern according to the invention is used on etching, the formation of burr due to re-attached matters to the mask can be prevented.

In the process for producing a thin film magnetic head according to the invention, the mask pattern has the two-layer structure, and the resist bridge part providing a space between the resist and the thin film, the formation of burr due to re-attached matters to the mask can be prevented on forming the thin film to the prescribed shape by etching.

Accordingly, by using the process for producing a thin film magnetic head according to the invention, deterioration of the shape of the thin film constituting the thin film-magnetic head is prevented to obtain a thin film magnetic head in that deterioration of characteristics due to the deterioration of the shape of the thin film is suppressed.

What is claimed is:

1. A process for forming a mask pattern comprising
    a first coating step of coating a first resist on a surface, on which said mask pattern is formed;
    a first exposure step of forming a pattern latent image in said first resist by exposing the first resist;
    a second coating step of coating a second resist on said first resist, in which said pattern latent image is formed in said first exposure step;
    a second exposure step of forming a pattern latent image in said second resist by exposing said second resist;
    a first development step of forming an upper layer mask pattern by developing said second resist, in which said latent image is formed in said second exposure step, with a first developer; and
    a second development step of forming a lower layer mask pattern by developing said first resist, in which said latent image is formed in said first exposure step, with a second developer,
    said upper layer mask pattern having a resist bridge part in a resist remaining part, in which said second resist remains, said bridge part bridging over a part of said lower mask pattern, in which said first resist is removed, and a space being present between said resist bridge part and said surface, on which said mask pattern is formed.

2. A process for forming a mask pattern as claimed in claim 1, wherein said first resist and said second resist are a positive resist.

3. A process for forming a mask pattern as claimed in claim 1, wherein said first resist and said second resist are an electron beam resist.

4. A process for forming a mask pattern as claimed in claim 1, wherein
    in said first development step and said second development step,
    said first developer is a developer having a solubility of said second resist in said developer is larger than a solubility of said first resist in said developer, and
    said second developer is a developer having a solubility of said first resist in said developer is larger than a solubility of said second resist in said developer.

5. A process for forming a mask pattern as claimed in claim 1, wherein said resist remaining part in said upper layer mask pattern is larger than said resist remaining part in said lower layer mask pattern.

6. A process for producing a thin film magnetic head comprising
    a thin film forming step of forming a thin film constituting said thin film magnetic head on a surface;
    a mask pattern forming step of forming a mask pattern on said thin film formed in said thin film forming step; and
    an etching step of shaping the thin film by removing said thin film that is exposed from said mask pattern formed in said mask pattern forming step by etching,
    the mask pattern forming step comprising
    a first coating step of coating a first resist on said thin film;
    a first exposure step of forming a pattern latent image in said first resist by exposing said first resist;
    a second coating step of coating a second resist on said first resist, in which said pattern latent image is formed in said first exposure step;
    a second exposure step of forming a pattern latent image in said second resist by exposing said second resist;
    a first development step of forming an upper layer mask pattern by developing said second resist, in which said latent image is formed in said second exposure step, with a first developer; and
    a second development step of forming a lower layer mask pattern by developing said first resist, in which said latent image is formed in said first exposure step, with a second developer,
    the upper layer mask pattern having a resist bridge part in a resist remaining part, in which said second resist remains, said bridge part bridging over a part of said lower mask pattern, in which said first resist is removed, and space being present between said resist bridge part and said surface, on which said mask pattern is formed.

7. A process for producing a thin film magnetic head as claimed in claim 6, wherein said first resist and said second resist are a positive resist.

8. A process for producing a thin film magnetic head as claimed in claim 6, wherein said first resist and said second resist are an electron beam resist.

9. A process for producing a thin film magnetic head as claimed in claim 6, wherein
    in said first development step and said second development step,
    said first developer is a developer having a solubility of said second resist in said developer is larger than a solubility of said first resist in said developer, and
    said second developer is a developer having a solubility of said first resist in said developer is larger than a solubility of said second resist in said developer.

10. A process for producing a thin film magnetic head as claimed in claim 6, wherein said resist remaining part in said upper layer mask pattern is larger than said resist remaining part in said lower layer mask pattern.

11. A process for producing a thin film magnetic head as claimed in claim 6, wherein said thin film is a film having a magnetoresistance effect.

12. A process for producing a thin film magnetic head as claimed in claim 11, wherein said film having a magnetoresistance effect is a film formed by laminating plural thin film layers and has a giant magnetoresistance effect.

13. A process for producing a thin film magnetic head as claimed in claim 12, wherein said film having a giant magnetoresistance effect is a spin valve film comprising a first ferromagnetic layer, a non-magnetic layer, a second ferromagnetic layer and an antiferromagnetic layer.

14. A process for producing a thin film magnetic head as claimed in claim 11, wherein in said etching step, said film having a magnetoresistance effect has a substantially rectangular shape, and a longitudinal direction of said film having a magnetoresistance effect is substantially parallel to a plane facing a magnetic recording medium.

15. A process for producing a thin film magnetic head as claimed in claim 11, wherein in said etching step, said film having a magnetoresistance effect has a substantially rectangular shape, and a longitudinal direction of said film having a magnetoresistance effect is substantially perpendicular to a plane facing a magnetic recording medium.

* * * * *